(12) United States Patent
Atobe et al.

(10) Patent No.: US 9,184,401 B2
(45) Date of Patent: Nov. 10, 2015

(54) ELECTRODE BODY FOR SOLAR CELL, METHOD FOR PRODUCING THE ELECTRODE BODY, AND SOLAR CELL PROVIDED WITH THE ELECTRODE BODY

(75) Inventors: Mahito Atobe, Yokohama (JP); Koji Nakabayashi, Yokohama (JP); Kenji Machida, Tokyo (JP); Sekihiro Takeda, Tokyo (JP)

(73) Assignee: NIPPON CHEMI-CON CORPORATION, Tokyo (JP)

( * ) Notice: Subject to any disclaimer, the term of this patent is extended or adjusted under 35 U.S.C. 154(b) by 228 days.

(21) Appl. No.: 14/008,137

(22) PCT Filed: Mar. 31, 2012

(86) PCT No.: PCT/JP2012/058762
§ 371 (c)(1),
(2), (4) Date: Sep. 27, 2013

(87) PCT Pub. No.: WO2012/133859
PCT Pub. Date: Oct. 4, 2012

(65) Prior Publication Data
US 2014/0014168 A1    Jan. 16, 2014

(30) Foreign Application Priority Data
Mar. 31, 2011  (JP) ................. 2011-080676

(51) Int. Cl.
*H01L 51/44*    (2006.01)
*H01B 1/12*    (2006.01)
(Continued)

(52) U.S. Cl.
CPC .............. *H01L 51/442* (2013.01); *H01B 1/127* (2013.01); *H01B 1/20* (2013.01); *H01G 9/20* (2013.01);
(Continued)

(58) Field of Classification Search
CPC .. H01L 31/02; H01L 31/0224; H01L 31/0216
USPC ......................................... 136/252, 256, 263
See application file for complete search history.

(56) References Cited

U.S. PATENT DOCUMENTS

2013/0037411 A1    2/2013   Atobe et al.

FOREIGN PATENT DOCUMENTS

JP            3-50813 A         3/1991
JP         2000-269087 A        9/2000
(Continued)

OTHER PUBLICATIONS

Asami et al., "Electropolymerization of an Immiscible Monomer in Aqueous Electrolytes Using Acoustic Emulsification", J. Am. Chem. Soc., vol. 127, 2005, pp. 13160-13161.
(Continued)

*Primary Examiner* — Susan D Leong
(74) *Attorney, Agent, or Firm* — Birch, Stewart, Kolasch & Birch, LLP

(57) ABSTRACT

Disclosed is an electrode body for a solar cell, which is capable of being used as a component of both an organic thin-film solar cell and a dye-sensitized solar cell, and has excellent heat resistance. This electrode body for a solar cell is provided with a substrate with a conductive part at least on the surface and a conductive polymer layer located on the conductive part of the substrate, in which the conductive polymer layer includes: a polymer which is obtained by polymerizing a monomer selected from the group consisting of 3,4-disubstituted thiophenes; and an anion as a dopant to the polymer generated from at least one organic non-sulfonate compound having an anion with the molecular weight of 200 or more. Since the anion of the organic non-sulfonate compound is included as a dopant in the conductive polymer layer, the heat resistance of the conductive polymer layer is improved.

20 Claims, 7 Drawing Sheets

(51) Int. Cl.
*H01B 1/20* (2006.01)
*H01G 9/20* (2006.01)
*H01L 51/00* (2006.01)
*H01L 51/42* (2006.01)
*H01M 14/00* (2006.01)

(52) U.S. Cl.
CPC .......... *H01G 9/2022* (2013.01); *H01L 51/0006* (2013.01); *H01L 51/0021* (2013.01); *C08G 2261/1424* (2013.01); *C08G 2261/3223* (2013.01); *C08G 2261/792* (2013.01); *C08G 2261/91* (2013.01); *H01G 9/2004* (2013.01); *H01G 9/2031* (2013.01); *H01G 9/2059* (2013.01); *H01L 51/0037* (2013.01); *H01L 51/0086* (2013.01); *H01L 51/4226* (2013.01); *H01L 51/441* (2013.01); *H01L 2251/306* (2013.01); *H01L 2251/308* (2013.01); *H01M 14/005* (2013.01); *Y02E 10/542* (2013.01); *Y02E 10/549* (2013.01)

(56) References Cited

FOREIGN PATENT DOCUMENTS

| JP | 2006-351289 A | 12/2006 |
| JP | 2007-119631 A | 5/2007 |
| WO | WO 2011/108254 A1 | 9/2011 |

OTHER PUBLICATIONS

Imoto et al., "Activated Carbon Counter Electrode for Dye-sensitized Solar Cell", Electrochemistry, vol. 71, No. 11, 2003, pp. 944-946.

International Search Report for International Application No. PCT/JP2012/058762 dated Jul. 3, 2012.

Xi et al., "The characteristics of the small molecule organic solar cells with PEDOT:PSS/LiF double anode buffer layer system", Solar Energy Materials & Solar Cells, vol. 94, 2010, pp. 623-628.

(A)　　　　　　　　　(B)

(A)　　　　　　　　　(B)

(A)      (B)

(A)      (B)

ELECTRODE BODY FOR SOLAR CELL, METHOD FOR PRODUCING THE ELECTRODE BODY, AND SOLAR CELL PROVIDED WITH THE ELECTRODE BODY

BACKGROUND OF THE INVENTION

1. Field of the Invention

The present invention relates to an electrode body for a solar cell with excellent heat resistance that can be used as a component of both an organic thin-film solar cell and a dye-sensitized solar cell, and a production method thereof. The present invention also relates to a solar cell with the electrode body.

2. Description of the Related Art

Organic solar cells, which can be roughly categorized into two types, organic thin-film solar cells and dye-sensitized solar cells, have the following advantages compared with silicon solar cells. The organic solar cells have no resource constraint, the production cost thereof can be curbed because of inexpensive raw materials and simple production processes, and they can be made lightweight and flexible.

An organic thin-film solar cell has a structure in which a photoelectric conversion layer with a hole transporter (p-type semiconductor) and an electron transporter (n-type semiconductor) is wedged between a positive electrode and a negative electrode. Generally, a transparent electrode, in which a vapor-deposited layer of semiconductive ceramics such as tin-doped indium oxide (ITO) and fluorine-doped tin oxide (FTO) is formed on the surface of a transparent substrate such as glass, is used as the positive electrode, and a metal electrode such as aluminum film and magnesium-silver alloy film, which has a smaller work function than ITO and FTO, is used as the negative electrode. When light is irradiated on the photoelectric conversion layer through the transparent electrode, an electron and a hole are formed in the photoelectric conversion layer, and the hole is transported to the positive electrode through the hole transporter, and the electron is transported to the negative electrode through the electron transporter, respectively, in isolation.

The performance of an organic thin-film solar cell is affected not only by the photoelectric conversion layer but the surface boundary between the positive electrode and the photoelectric conversion layer. Due to the poor smoothness and adhesiveness between the positive electrode and the photoelectric conversion layer, the transport efficiency of a hole from the photoelectric conversion layer to the positive electrode is decreased, which lowers the short-circuit current density of a solar cell and decreases the photoelectric conversion efficiency. To prevent this, a hole extraction layer composed of a conductive polymer layer with hole transportation capability is placed between the positive electrode and the photoelectric conversion layer. This hole extraction layer mainly has the function of smoothing the surface of the positive electrode and decreasing the interface resistance between the photoelectric conversion layer and the positive electrode.

As the hole extraction layer, a layer of polythiophene, especially a polystyrene sulfonate of poly(3,4-ethylenedioxythiophene) has been frequently used (hereinafter 3,4-ethylenedioxythiophene is referred to as "EDOT", poly(3,4-ethylenedioxythiophene) as "PEDOT", polystyrene sulfonic acid as "PSS", and a polystyrene sulfonate of poly(3,4-ethylenedioxythiophene) as "PEDOT:PSS"). For example, Non-patent Document 1 (Solar Energy Materials & Solar Cells 94 (2010) 623-628) discloses an organic thin-film solar cell that is produced by forming a hole extraction layer by spin-coating an aqueous PEDOT:PSS dispersion on a positive electrode having an ITO layer on a glass substrate, and then forming a hole transporter layer consisting of copper-phthalocyanine, an electron transporter layer consisting of fullerene, a hole block layer consisting of a thin film of lithium fluoride, and a negative electrode consisting of an aluminum film by a vacuum deposition method in this order. This Document reports that asperity of the surface of the ITO electrode was remarkably improved by the PEDOT:PSS hole extraction layer, the transport efficiency of a hole from the photoelectric conversion layer to the positive electrode was remarkably improved, and as a result the short-circuit current density of the solar cell was greatly increased.

A dye-sensitized solar cell has a structure in which an electrolyte layer containing paired oxidized species and reduced species is wedged between a negative electrode with a semiconductor layer containing a pigment as a photosensitizer and a positive electrode with a catalyst layer to convert the oxidized species in the electrolyte layer to the reduced species. Generally, an electrode in which an oxide semiconductor layer supporting a pigment such as ruthenium complex is formed on the above-mentioned transparent electrode is used as a negative electrode and an electrode in which Pt is bonded on a substrate such as the above-mentioned transparent electrode or steel by a sputtering method or a vacuum deposition method is used as a positive electrode. When light is irradiated on the pigment of the semiconductor layer through the transparent electrode, the pigment absorbs light energy and becomes excited, and emits an electron toward the semiconductor. The emitted electron moves from the semiconductor layer to the transparent electrode, and further moves from the transparent electrode to the positive electrode via an external circuit. Then, by the action of the Pt catalyst layer of the positive electrode, the oxidized species (for example, $I_3^-$) in the electrolyte layer receives an electron from the positive electrode and is converted to the reduced species (for example, $I^-$), and further, the reduced species (for example, $I^-$) emits the electron toward the pigment and is converted to the oxidized species (for example, $I_3^-$).

The Pt catalyst layer of the positive electrode has a problem in that, though it has excellent catalytic activity to convert an oxidized species of an electrolyte layer into a reduced species, it is expensive and does not have enough durability against $I^-$ ions when water exists. Therefore, a conductive material as a substitute of the Pt catalyst layer has been hitherto considered, and a polythiophene layer, especially a PEDOT:PSS layer has been considered. For example, Non-patent Document 2 (Electrochemistry 71, No. 11 (2003) 944-946) reports the results of selecting an electrode with three types of conductive polymer layer, a PEDOT:PSS electrode, a polyaniline electrode and a polypyrrole electrode, evaluating a cyclic voltammogram in an electrolyte containing an $I^-/I_3^-$ redox pair and making a comparison with that of a Pt electrode. While the cyclic voltammogram of the Pt electrode clearly shows a reduction wave from $I_3^-$ to $I^-$, the cyclic voltammograms of the PEDOT:PSS electrode and the polypyrrole electrode hardly show a reduction wave from $I_3^-$ to $I^-$, and the cyclic voltammogram of the polyaniline electrode does not show an oxidation-reduction wave at all.

PRIOR ARTS DOCUMENTS

Non-Patent Documents

Non-patent Document 1: Solar Energy Materials & Solar Cells 94 (2010) 623-628
Non-patent Document 2: Electrochemistry 71, No. 11 (2003) 944-946

BRIEF SUMMARY OF THE INVENTION

1. Problems to be Solved by the Invention

As mentioned above, a PEDOT:PSS layer is a conductive polymer layer which is also considered as a hole extraction layer of an organic thin-film solar cell or a catalyst layer in a positive electrode of a dye-sensitized solar cell. However, the PEDOT:PSS layer has a problem that it exhibits high water absorption.

In this regard, Non-patent Document 1 reports that the characteristics of an organic thin-film solar cell with a PEDOT:PSS hole extraction layer rapidly deteriorate when the solar cell is left without light irradiation in an atmosphere in which temperature is 25 degrees centigrade and humidity is 55% because the PEDOT:PSS layer absorbs vapor from the atmosphere and this leads to increased sheet resistance. Further, as PSS is a diffusion-prone material, there is a concern that it diffuses and reacts with other components of a solar cell. Moreover, since an aqueous PEDOT:PSS dispersion for composing a hole extraction layer is an acid material having a pH of less than 3, it may decompose other components of the solar cell.

Also, catalytic activity to reduce the oxidized species of the electrolyte layer is especially required for the positive electrode of a dye-sensitized solar cell, but as is shown in Non-patent Document 2, the $I_3^-$ reduction reaction does not easily occur even in a PEDOT:PSS electrode, nor needless to say, in a polyaniline electrode or a polypyrrole electrode, and then sufficient reproduction of $I^-$ is difficult; therefore, it does not have a satisfactory performance as a positive electrode of a dye-sensitized solar cell.

Moreover, as each component of a solar cell may experience high temperature in the manufacturing process of the solar cell, and the outdoor use of the solar cell in extremely hot weather is envisaged, enough heat resistance is required for each component of the solar cell. However, a PEDOT:PSS layer hitherto considered as a hole extraction layer of an organic thin-film solar cell or a catalyst layer of a positive electrode of a dye-sensitized solar cell does not have satisfactory heat resistance.

Therefore, the objective of the present invention is to provide an electrode body for a solar cell that can be used as a component of both an organic thin-film solar cell and a dye-sensitized solar cell and also has excellent heat resistance, and a production method thereof.

2. Means for Solving Problems

It has been found after keen examination that the above-mentioned objective is achieved by selecting an anion generated from an organic non-sulfonate compound having an anion with the molecular weight of 200 or more, as a dopant to a conductive polymer derived from a 3,4-disubstituted thiophene (hereinafter referred to as "substituted thiophene"). The "organic non-sulfonate compound" means an organic compound that does not have a sulfonic acid group and/or a sulfonic acid salt group.

Therefore, the present invention, in the first place, relates to an electrode body for a solar cell comprising a substrate with a conductive part at least on the surface and a conductive polymer layer on the conductive part of the substrate, in which the conductive polymer layer comprises: a polymer derived from at least one substituted thiophene; and an anion as a dopant to the polymer generated from at least one organic non-sulfonate compound having an anion with the molecular weight of 200 or more.

The conductive polymer layer in the electrode body for a solar cell of the present invention has excellent hole transportation capability and also has excellent catalytic activity to convert an oxidized species into a reduced species in a redox pair. Also, this conductive polymer layer is stable against moisture in the atmosphere and has excellent heat resistance.

The conductive polymer layer comprises, as a dopant, an anion generated from an organic non-sulfonate compound having an anion with the molecular weight of 200 or more. An anion generated from an inorganic compound, or even in the case of an organic compound, an anion generated from a compound with a sulfonic acid group and/or a sulfonic acid salt group, or, even in an organic compound without a sulfonic acid group and/or a sulfonic acid salt group, an anion produced from a compound in which the molecular weight of the anion is less than 200 does not produce a conductive polymer layer with an excellent heat resistance.

Especially, it is preferable that the organic non-sulfonate compound is selected from the group consisting of borodisalicylic acid, borodisalicylic salts, a sulfonylimidic acid of the formula (I) or the formula (II)

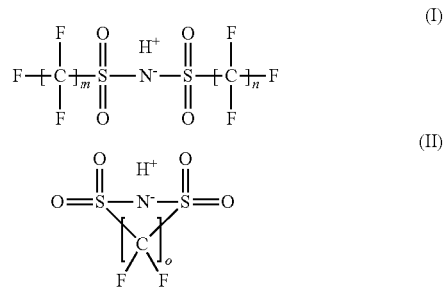

where m is an integer from 1 to 8, preferably an integer from 1 to 4, especially preferably 2, n is an integer from 1 to 8, preferably an integer from 1 to 4, especially preferably 2, and o is 2 or 3, and salts thereof. The anions of these organic non-sulfonate compounds produce a conductive polymer layer with outstanding heat resistance. Among all compounds, a salt of bis(pentafluoroethanesulfonyl)imide acid is particularly preferable.

In the electrode body for a solar cell of the present invention, the monomer constituting the conductive polymer can be of any compound without limitation as long as it is selected from the group consisting of the substituted thiophenes, that is, 3,4-disubstituted thiophenes. Substituents at the 3- and 4-positions of the thiophene ring can form a ring with carbons at the 3- and 4-positions. Especially, it is preferable if the monomer is EDOT, because a conductive polymer layer with excellent environmental stability and optical permeability (transparency) is obtained, and because an electrode body of a solar cell with excellent optical permeability (transparency)

is obtained by using a transparent substrate as a substrate. The transparent substrate can be obtained by placing a transparent semiconductive ceramic layer such as an ITO layer, a tin oxide layer or a FTO layer on the surface of a transparent and insulating glass substrate or plastic substrate by vapor deposition or coating.

The electrode body for a solar cell of the present invention can be obtained by electrolytic polymerization using a transparent polymerization solution in which the organic non-sulfonate compound within the specific range mentioned above is contained as a supporting electrolyte and a substituted thiophene is contained as oil drops in water as a solvent. The "transparent polymerization solution" means a polymerization solution in which, among the oil drops of the substituted thiophene dispersed in the polymerization solution, 90% or more of the total number of oil drops have the diameter of 250 nm or less. The size of the oil drops can be measured with a dynamic light scattering method.

After an opaque dispersion in which the substituted thiophene is dispersed as oil drops in water as a solvent is obtained by irradiating an ultrasonic wave into a phase separation solution in which the substituted thiophene in more than the saturated solution amount is added to water, if an ultrasonic wave at a higher frequency is irradiated to the opaque dispersion, the size (diameter) of the oil drops of substituted thiophene can be easily decreased, and a transparent dispersion the whole of which looks transparent can be easily obtained. In a transparent polymerization solution, such minute oil drops of substituted thiophene exist in a high dispersion state, light scattering by the oil drops is not practically found, and the whole polymerization solution looks transparent. The "ultrasonic wave" means a sonic wave at a frequency of 10 kHz or more.

The organic non-sulfonate compound within the specific range mentioned above can be added to any one of the phase separation solution, the opaque dispersion or the transparent dispersion. This compound is also referred to as an "organic non-sulfonate supporting electrolyte" because it acts as a supporting electrolyte in a polymerization solution. However, a borodisalicylate ion contained in borodisalicylic acid and its salts is known to hydrolyze into salicylic acid and boric acid in water, which have extremely low solubility in water. Therefore, if borodisalicylic acid and/or its salt are used as a supporting electrolyte, precipitation is gradually produced in a polymerization solution and the solution becomes no longer usable. To avoid this, if borodisalicylic acid and/or its salt are used as a supporting electrolyte, electrolytic polymerization is carried out after addition of this supporting electrolyte to the solution and before precipitate formation, or, the supporting electrolyte is used concurrently with p-nitrophenol. No precipitation is produced from a polymerization solution containing p-nitrophenol and borodisalicylate ions probably because p-nitrophenol inhibits the hydrolysis of borodisalicylate ions. When the supporting electrolyte is used concurrently with p-nitrophenol, p-nitrophenol is added almost at the same time as borodisalicylic acid and/or its salt, or p-nitrophenol is added prior to borodisalicylic acid and/or its salt.

When a substrate with a conductive part at least on the surface is introduced into the transparent polymerization solution and electrolytic polymerization is performed, electrolytic polymerization smoothly proceeds with direct charge transfer between the minute oil drops in the polymerization solution and the conductive part of the substrate, and a conductive polymer layer, in which the polymer particles are of a size almost the same as the size of the minute oil drops, that is, they are polymer particles that look transparent, and in which they are densely accumulated is formed on the conductive part of the substrate. If electrolytic polymerization is performed with a polymerization solution in which a substituted thiophene in the saturated solution amount or less is added to water, which has small environmental burden and is economically excellent, it may take a long time to obtain a conductive polymer layer with a desired thickness because of the low solubility of substituted thiophene in water, but by dispersing the monomer as minute oil drops in water, this problem is solved because electrolytic polymerization proceeds smoothly.

Therefore, the present invention relates to a method for producing the electrode body for a solar cell, comprising:
(A) a preparation process of obtaining a polymerization solution which comprises water as a solvent; the substituted thiophene as a monomer dispersed as oil drops in water; and the organic non-sulfonate compound, and which is transparent, by the following steps (a1) to (a4):
  (a1) a step of adding the substituted thiophene to water to prepare a phase separation solution where water and the substituted thiophene are phase-separated;
  (a2) a step of irradiating the phase separation solution with an ultrasonic wave to make the substituted thiophene dispersed in the form of oil drops and thus prepare an opaque dispersion;
  (a3) a step of irradiating the opaque dispersion with an ultrasonic wave having a frequency higher than that of the ultrasonic wave used in the step (a2) to reduce the mean size of the oil drops of the substituted thiophene and thus prepare a transparent dispersion;
  (a4) a step of adding the organic non-sulfonate compound as a supporting electrolyte to the phase separation solution, the opaque dispersion or the transparent dispersion; and
(B) a polymerization process of introducing the substrate to the polymerization solution and performing electrolytic polymerization to form the conductive polymer layer by polymerization of the substituted thiophene on the conductive part of the substrate.

Since the conductive polymer layer is formed on the conductive part of the substrate with excellent adhesion by electrolytic polymerization, the interface resistance between the conductive part and the conductive polymer layer is small. Also, the conductive polymer layer obtained from electrolytic polymerization has excellent hole transportation capability, excellent catalytic activity to convert an oxidized species to a reduced species in a redox pair, and excellent heat resistance. Moreover, the conductive polymer layer obtained from electrolytic polymerization is air-moisture stable and in no danger of decomposing other components of the solar cell.

The step (a2) can be suitably implemented by using an ultrasonic wave with a frequency of 15 to 200 kHz and a comparatively high-output, preferably an output of 4 W/cm$^2$ or more, and the step (a3) can be suitably implemented by using an ultrasonic wave with a frequency of 1 to 4 MHz and a comparatively high-output, preferably an output of 5 W/cm$^2$ or more. If the frequency of the ultrasonic wave in the step (a2) is less than 15 kHz or more than 200 kHz, or the output of the ultrasonic wave in the step (a2) is less than 4 W/cm$^2$, cavitation, which is preferable to obtain an opaque dispersion, becomes hard to be generated. Moreover, if the frequency of the ultrasonic wave in the step (a3) is less than 1 MHz or more than 4 MHz, or the output of the ultrasonic wave in the step (a3) is less than 5 W/cm$^2$, cavitation, which is suitable to decrease the mean size of the oil drops of the substituted thiophene formed in the step (a2) until a transparent dispersion can be obtained, becomes hard to be generated.

In the manufacturing method of an electrode body for a solar cell of the present invention, the step (a2) and the step (a3) can be carried out once in turn (for example, the step (a2) can be performed using an ultrasonic wave with the frequency of 20 kHz and at the output of 10 W/cm$^2$ and the step (a3) can be performed using an ultrasonic wave with the frequency of 1 MHz and at the output of 20 W/cm$^2$), but the step (a2) can be carried out more than once using ultrasonic waves with different frequencies and/or outputs (for example, using an ultrasonic wave with the frequency of 20 kHz and at the output of 10 W/cm$^2$ and thereafter using an ultrasonic wave with the frequency of 50 kHz and at the output of 20 W/cm$^2$), and/or the step (a3) can be carried out more than once using ultrasonic waves with different frequencies and/or outputs (for example, using an ultrasonic wave with the frequency of 1 MHz and at the output of 20 W/cm$^2$ and thereafter using an ultrasonic wave with the frequency of 2 MHz and at the output of 10 W/cm$^2$). Especially, it is preferable to implement the step (a3) more than once under the condition that the frequency of the ultrasonic wave is increased as the number of the iterations increases. By repeating the step (a3) more than once, the oil drops of the substituted thiophene become further atomized, and conductivity and transparency of the conductive polymer layer obtained by electrolytic polymerization using this polymerization solution is further improved.

The opaque dispersion or the transparent dispersion can be obtained even if the length of time of ultrasonic irradiation in the step (a2) or the step (a3) is about 1 minute, but it is preferable that the length of time of ultrasonic irradiation prolongs, because aggregation of the oil drops of the substituted thiophene is inhibited and thus the time period before demulsification is prolonged. The length of time of ultrasonic irradiation in the step (a2) is preferably within the range of 2 to 10 minutes and the length of time of ultrasonic irradiation in the step (a3) is preferably within the range of 2 to 10 minutes. If the length of time of ultrasonic irradiation in the step (a2) and the step (a3) is 10 minutes or more, it is found that the effect to inhibit aggregation of oil drops tends to be saturated.

The method itself to make use of irradiation of ultrasonic waves in the preparation of a polymerization solution for electrolytic polymerization is heretofore known. J. AM. CHEM. SOC. (2005), 127(38), 13160-13161 reports the result of adding an amount of EDOT more than the saturated solution amount to an aqueous solution in which LiClO$_4$ as a supporting electrolyte is dissolved, irradiating ultrasonic waves at a frequency of 20 kHz and with an output of 22.6 W/cm$^2$ for 60 seconds, obtaining an opaque polymerization solution in which monomer oil drops are dispersed in water (see FIG. 1 of this document), and forming an electropolymerized layer on a Pt electrode using this polymerization solution. However, this document does not include a statement to suggest the supporting electrolyte to be used in the present invention, or a statement to suggest that an electrode body for a solar cell with excellent heat resistance is obtained by using this supporting electrolyte.

The electrode body for a solar cell of the present invention can be suitably used as a component of an organic thin-film solar cell because the conductive polymer layer formed on the substrate has excellent hole transportation capability. Therefore, the present invention also relates to an organic thin-film solar cell comprising: a positive electrode with a conductive part at least on the surface; a hole extraction layer located on the conductive part of the positive electrode; a photoelectric conversion layer located on the hole extraction layer having a hole transporter and an electron transporter; and a negative electrode located on the photoelectric conversion layer, in which the positive electrode and the hole extraction layer are composed of the electrode body for a solar cell of the present invention.

The electrode body for a solar cell of the present invention is also suitably used as a component for a dye-sensitized solar cell because the conductive polymer layer formed on the substrate has excellent reduction catalytic activity. Therefore, the present invention also relates to a dye-sensitized solar cell comprising: a negative electrode having a semiconductor layer with a pigment as a photosensitizer; an electrolyte layer located on the semiconductor layer of the negative electrode having paired oxidized species and reduced species; and a positive electrode located on the electrolyte layer having a conductive polymer layer that acts as a catalyst to convert the oxidized species into the reduced species, in which the positive electrode is composed of the electrode body for a solar cell of the present invention.

3. Advantageous Effects of the Invention

The conductive polymer layer formed on the substrate in the electrode body for a solar cell of the present invention has excellent hole transportation capability, excellent catalytic activity to convert an oxidized species to a reduced species in a redox pair, and excellent heat resistance. Therefore, the electrode body for the solar cell of the present invention can be suitably used as a component for both an organic thin-film solar cell and a dye-sensitized solar cell.

Figure 1:
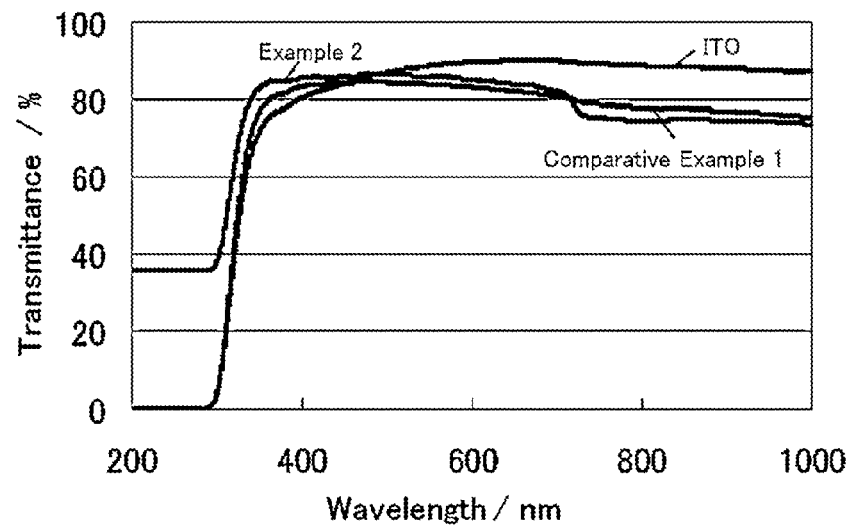
In FIG. 1, the optical transmittance of an electrode body obtained from a polymerization solution containing ammonium borodisalicylate and EDOT oil drops is compared with the optical transmittance of an electrode body obtained from a slurry containing PEDOT:PSS.

DETAILED DESCRIPTION OF THE INVENTION (1) Electrode Body for a Solar Cell

An electrode body for a solar cell of the present invention comprising a substrate with a conductive part at least on the surface and a conductive polymer layer located on the conductive part of the substrate is characterized by the fact that the conductive polymer layer comprises a polymer derived from a substituted thiophene as a monomer and an anion as a dopant to the polymer generated from at least one organic non-sulfonate compound having an anion with the molecular weight of 200 or more.

This electrode body for a solar cell can be suitably produced by a method comprising:
(A) a preparation process of obtaining a polymerization solution which comprises water as a solvent; the substituted thiophene as a monomer dispersed as oil drops in water; and the organic non-sulfonate compound, and which is transparent, by the following steps (a1) to (a4):
(a1) a step of adding the substituted thiophene to water to prepare a phase separation solution where water and the substituted thiophene are phase-separated;
(a2) a step of irradiating the phase separation solution with an ultrasonic wave to make the substituted thiophene dispersed in the form of oil drops and thus prepare an opaque dispersion;
(a3) a step of irradiating the opaque dispersion with an ultrasonic wave having a frequency higher than that of the ultrasonic wave used in the step (a2) to reduce the mean size of the oil drops of the substituted thiophene and thus prepare a transparent dispersion;
(a4) a step of adding the organic non-sulfonate compound as a supporting electrolyte to the phase separation solution, the opaque dispersion or the transparent dispersion; and
(B) a polymerization process of introducing the substrate to the polymerization solution and performing electrolytic polymerization to form the conductive polymer layer by polymerization of the substituted thiophene on the conductive part of the substrate. Detailed explanations of each process are hereinafter given.

(A) Preparation Process
Step (a1)
In step (a1), a monomer is added to water, and a phase separation solution in which water and the monomer are phase-separated is obtained. For a polymerization solution, water, which has small environmental burden and is economically excellent, is used as a solvent, and for the monomer, a poorly water-soluble substituted thiophene, that is, a 3,4-disubstituted thiophene is used.

Substituents at the 3- and 4-positions of the thiophene ring can form a ring with carbons at the 3- and 4-positions. Examples of monomers that can be used are; 3,4-dialkoxythiophenes such as 3,4-dimethoxythiophene and 3,4-diethoxythiophene; 3,4-alkylenedioxythiophenes such as 3,4-methylenedioxythiophene, EDOT and 3,4-(1,2-propylenedioxy)thiophene; 3,4-alkyleneoxythiathiophenes such as 3,4-methyleneoxythiathiophene, 3,4-ethyleneoxythiathiophene and 3,4-(1,2-propyleneoxythia)thiophene; 3,4-alkylenedithiathiophenes such as 3,4-methylenedithiathiophene, 3,4-ethylenedithiathiophene and 3,4-(1,2-propylenedithia)thiophene; and alkylthieno[3,4-b]thiophenes such as thieno[3,4-b]thiophene, isopropylthieno[3,4-b]thiophene and t-butyl-thieno[3,4-b]thiophene. The monomer can be a single compound or two or more types of compounds. In particular, usage of EDOT is preferred.

In the step (a1), a supporting electrolyte as well as the substituted thiophene can be added to water (step (a4)). For the supporting electrolyte, an organic non-sulfonate compound having an anion with the molecular weight of 200 or more is used. Borodisalicylic acid, borodisalicylic salts, a sulfonylimidic acid of the formula (I) or the formula (II)

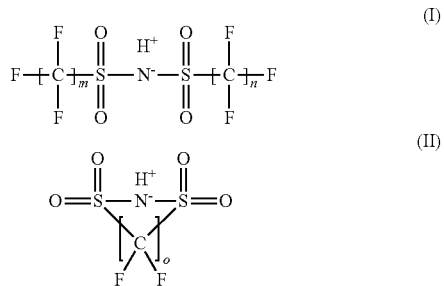

where m is an integer from 1 to 8, preferably an integer from 1 to 4, especially preferably 2, n is an integer from 1 to 8, preferably an integer from 1 to 4, especially preferably 2, and o is 2 or 3, and salts thereof, are preferably used as the supporting electrolyte. For salts, alkali metal salts such as lithium salt, sodium salt and potassium salt; ammonium salt; alkylammonium salts such as ethylammonium salt and butylammonium salt; dialkylammonium salts such as diethylammonium salt and dibutylammonium salt; trialkylammonium salts such as triethylammonium salt and tributylammonium salt; and tetraalkylammonium salts such as tetraethylammonium salt and tetrabutylammonium salt can be exemplified. These supporting electrolytes give conductive polymers with outstanding heat resistance. Among them, salts of bis(pentafluoroethanesulfonyl)imide acid, such as potassium salt, sodium salt, and ammonium salt are particularly preferable. In case borodisalicylic acid and/or its salt are used at this stage, they are used concurrently with p-nitrophenol. The supporting electrolyte can be a single compound or two or more types of compounds.

The substituted thiophene is used as a monomer in a quantity that is more than the saturated solubility in a polymerization solution, that is, in a quantity in which the substituted thiophene exceeding the saturated solubility becomes phase-separated from water in the stationary state. The quantity that is more than the solubility of the substituted thiophene can be a quantity in which demulsification is inhibited by ultrasonic irradiation and in which a transparent dispersion can be obtained, which changes according to the kind and the quantity of the supporting electrolyte and the condition of ultrasonic irradiation as well as the kind of monomer. If EDOT is used as a monomer, it is generally preferable to add to water 20 to 30 mmol of EDOT per liter of water.

The organic non-sulfonate supporting electrolyte is used in a quantity that is saturated solubility or less, which is dependent on the kind of supporting electrolyte, and at a concentration at which a sufficient current for electrolytic polymerization can be obtained, preferably at a concentration of 10 mmol or more per liter of water. If the supporting electrolyte is too concentrated, it becomes difficult for the substituted thiophene to disperse as oil drops and a transparent dispersion become difficult to be obtained. The supporting electrolyte can be added at the step (a1), but is not limited to this step; it can be added between below-mentioned steps (a2) and (a3), or after step (a3).

The phase separation solution which contains water, the substituted thiophene and, as the case may be, the organic non-sulfonate supporting electrolyte, and the phase separation solution in which water and the substituted thiophene are phase-separated is then subjected to ultrasonic treatment. The polymerization solution used for electrolytic polymerization of the substituted thiophene in the present invention is a transparent polymerization solution in which the substituted thiophene is dispersed as oil drops in water, that is, a polymerization solution in which 90% or more of the total number of oil drops of the substituted thiophene in the polymerization solution have a diameter of 250 nm or less. To obtain such minute oil drops by irradiation of ultrasonic waves, at least the same size, preferably the size 100 nm or less of a cavitation needs to be generated, but the cavitation with a size of 100 nm or less is too small and has too small a mechanical action to uniformly disperse the phase-separated substituted thiophene so that it practically has no effect to disperse the substituted thiophene. Therefore, the polymerization solution used for the electrolytic polymerization of the substituted thiophene in the present invention can be suitably obtained by implementing the following step (a2) and the subsequent step (a3).

Step (a2)

In step (a2), the substituted thiophene is dispersed as oil drops by applying ultrasonic treatment to the phase separation solution obtained in the step (a1), after which an opaque dispersion is obtained. In the opaque dispersion, though oil drops with a diameter of several μm or less are dispersed in water in a high-dispersion state, more than 10% of the total number of oil drops have a diameter of more than 250 nm, and the whole fluid looks opaque by light scattering due to the presence of oil drops.

As an ultrasonic oscillator used for the step (a2), an ultrasonic oscillator which is heretofore been known, such as one for an ultrasonic washing machine or a cell crusher, can be used without any restriction. In this step, an ultrasonic wave that can generate a cavitation with a diameter of several hundred nm to several μm, which has a strong mechanical activity, is irradiated into the phase separation solution. The frequency of the ultrasonic wave is preferably within the range of 15 to 200 kHz, and especially preferably within the range of 20 to 100 kHz. The output of the ultrasonic wave is preferably 4 W/cm$^2$ or more.

There is no strict restriction on the duration of ultrasonic wave irradiation in the step (a2) as long as an opaque dispersion can be obtained, but it is preferably within the range of 2 to 10 minutes. If the time length of irradiation is longer, aggregation of oil drops of the substituted thiophene is inhibited and the time elapsing until demulsification tends to be prolonged, but if the time length of ultrasonic wave irradiation is 10 minutes or more, it is found that the effect to inhibit aggregation of oil drops tends to be saturated. There is no specific restriction on the temperature of the phase separation solution during ultrasonic irradiation as long as composition change of the fluid does not take place and a stable opaque dispersion can be obtained, but generally it is within the range of 10 to 60 degrees centigrade.

In the present invention, the step (a2) can be carried out once, for example, with an ultrasonic wave with the frequency of 20 kHz and the output of 10 W/cm$^2$, but the step (a2) can be carried out more than once using ultrasonic waves with different frequencies and/or outputs (for example, using an ultrasonic wave with the frequency of 20 kHz and at the output of 10 W/cm$^2$ and thereafter using an ultrasonic wave with the frequency of 50 kHz and at the output of 20 W/cm$^2$).

Step (a3)

A transparent dispersion, that is, a dispersion in which 90% or more of the total number of oil drops of the substituted thiophene have a diameter of 250 nm or less, can be obtained by following the step (a2), but irradiating an ultrasonic wave at a frequency higher than the frequency of the ultrasonic wave in the step (a2) into the opaque dispersion and reducing the mean size of the oil drops of the substitute thiophene. If the organic non-sulfonate supporting electrolyte was not added to the phase separation solution, it can be added to the opaque dispersion before the step (a3) (step (a4)). In a case where borodisalicylic acid and/or its salt are used at this stage, they are used concurrently with p-nitrophenol.

As an ultrasonic oscillator used for the step (a3), an ultrasonic oscillator which is heretofore known, such as one for an ultrasonic washing machine or a cell crusher can be used without any restriction. In order to make the size of the oil drops of the substituted thiophene in the opaque dispersion 250 nm or less, an ultrasonic wave that has weak mechanical activity but can generate at least the same size, preferably 100 nm or less, of cavitation is used in this step. The frequency of the ultrasonic wave is preferably within the range of 1 to 4 MHz and the output of the ultrasonic wave is preferably 5 W/cm$^2$ or more. If the frequency of the ultrasonic wave is more than 4 MHz, cavitation no longer generates.

The time length of the ultrasonic wave irradiation in the step (a3) has no restriction as long as a transparent dispersion can be obtained, but it is preferably within the range of 2 to 10 minutes. As the time length of irradiation is longer, aggregation of oil drops of the substituted thiophene is inhibited and the time elapsing until demulsification tends to be prolonged, but if the time length of ultrasonic wave irradiation is 10 minutes or more, it is found that the effect to inhibit aggregation of oil drops tends to be saturated. There is no specific restriction on the temperature of the opaque dispersion at ultrasonic irradiation as long as composition change of the fluid does not take place and a stable transparent dispersion can be obtained, but generally it is within the range of 10 to 60 degrees centigrade.

The step (a3) can be carried out once, for example, with an ultrasonic wave with the frequency of 1 MHz and the output of 20 W/cm$^2$, but the step (a3) can be carried out more than once using ultrasonic waves with different frequencies and/or outputs (for example, using an ultrasonic wave with a frequency of 1 MHz and at the output of 20 W/cm$^2$ and thereafter using an ultrasonic wave with a frequency of 2 MHz and at the output of 10 W/cm$^2$). Especially, it is preferable to implement the step (a3) more than once under the condition that the frequency of the ultrasonic wave is increased as the number of the iterations increases. By repeating the step (a3) more than once, the oil drops of the substituted thiophene become further smaller, and an especially preferable polymerization solution that gives a conductive polymer layer with high electric conductivity and high transparency can be easily obtained.

In the production method for an electrode body for a solar cell of the present invention, electrolytic polymerization is carried out with the transparent dispersion obtained from the step (a3) as a polymerization solution, but in a case where the organic non-sulfonate supporting electrolyte is not added to the phase separation solution and the opaque dispersion, the supporting electrolyte can be added to the transparent dispersion before electrolytic polymerization (step (a4)). In a case where borodisalicylic acid and/or its salt are used at this stage, they do not need to be used concurrently with p-nitrophenol.

(B) Polymerization Process

By introducing a working electrode with a conductive part at least on the surface (a substrate of a conductive polymer layer) and a counter electrode into the polymerization solution obtained by the above-mentioned preparation process, and then performing electrolytic polymerization, a conductive polymer layer by polymerization of the substituted thiophene is formed on the conductive part of the working electrode and an electrode body for a solar cell is obtained. The type of the working electrode is selected according to the intended usage of the electrode body for a solar cell.

In a case where an electrode body for a solar cell is to be used as a positive electrode and a hole extraction layer of an organic thin-film solar cell, a substrate with a conductive part, which has a larger work function than that of a negative electrode to be used in the organic thin-film solar cell, is selected as the working electrode. For example, a substrate at least on the surface with a layer of a metal with a larger work function such as gold, silver, cobalt, nickel and platinum, or a layer of a semiconductive ceramic such as tin-doped indium oxide (ITO), tin oxide, and fluorine-doped tin oxide (FTO), can be used as the working electrode. The conductive part can be a single layer or a combination of layers with different work functions.

Since the conductive polymer layer obtained by this polymerization process has excellent transparency, it is preferable to use as the working electrode a transparent substrate in which a transparent layer of conductive material such as ITO, tin oxide, zinc oxide, and FTO is formed by vapor deposition or coating on the surface of an insulating transparent substrate of glass such as optical glass, quartz glass, and alkali-free glass or plastic such as polyethylene naphthalate, polycarbonate, and polyacrylate.

In a case where an electrode body for a solar cell is to be used as a positive electrode of a dye-sensitized solar cell, a substrate with a conductive part at least on the surface can be used as the working electrode, and the conductive part can be a single layer or include multiple different layers. For example, a plate or foil of conductive material such as platinum, nickel, titanium, and steel can be used as the working electrode. However, since the conductive polymer layer obtained by this polymerization process has excellent transparency, it is preferable to use as the working electrode a transparent substrate in which a transparent layer of conductive material such as ITO, tin oxide, zinc oxide, and FTO is formed by vapor deposition or coating on the surface of an insulating transparent substrate of glass such as optical glass, quartz glass, and alkali-free glass or plastic such as polyethylene terephthalate, polyethylene naphthalate, and polycarbonate.

As the counter electrode of electrolytic polymerization, a board of platinum, nickel or the like can be used.

Electrolytic polymerization is performed using the polymerization solution obtained in the preparation process by any of a potentiostatic method, a galvanostatic method or a potential sweep method. In the case of the potentiostatic method, a potential of 1.0 to 1.5 V for a saturated calomel electrode is preferable though this depends on the type of monomer; and in the case of galvanostatic method, a current value of 1 to 10000 $\mu$A/cm$^2$, preferably 5 to 500 $\mu$A/cm$^2$, and more preferably 10 to 100 $\mu$A/cm$^2$ is preferable though this depends on the type of monomer; and in the case of the potential sweep method, it is preferable to sweep a range of −0.5 to 1.5 V for a saturated calomel electrode at a velocity of 5 to 200 mV/s though this depends on the type of monomer.

By electrolytic polymerization using the transparent polymerization solution, electrolytic polymerization smoothly proceeds with direct charge transfer between the minute oil drops in the polymerization solution and the conductive part of the substrate, and a conductive polymer layer, in which the polymer particles are of a size almost the same as the size of the minute oil drops, that is, they are polymer particles that look transparent, and in which they are densely accumulated is formed on the conductive part of the working electrode. An anion of the organic non-sulfonate supporting electrolyte within the specific range mentioned above is included as a dopant in the conductive polymer layer. The thickness of the conductive polymer layer is generally in the range of 1 to 1000 nm, preferably 5 to 500 nm. It is not preferable if the thickness is less than 1 nm because the smoothing effect of the asperity of the conductive part in the substrate becomes difficult to be obtained, or if the thickness is more than 1000 nm because the internal resistance of the conductive polymer layer becomes large. The polymerization temperature has no strict limitation, but is generally within a range of 10 to 60 degrees centigrade. The polymerization time is generally within a range of 0.6 seconds to 1 hour, preferably 0.6 seconds to 2 minutes, and especially preferably 6 seconds to 1 minute. Moreover, if a transparent substrate is used as a working electrode, it is preferable that the transmittance of the light that transmits through both the transparent substrate and the conductive polymer layer is about 80% or more, and preferably about 85% or more so that a sufficient quantity of light is irradiated into a photoelectric conversion layer.

By cleaning the conductive polymer layer after electrolytic polymerization with water, ethanol or the like, and drying it, an electrode body for a solar cell in which a conductive polymer layer with excellent heat resistance is formed with good adhesion on a substrate can be obtained. The conductive polymer layer in the electrode body for a solar cell of the present invention is air-moisture stable, and there is no danger that other components will be eroded in the process of manufacture or usage of the solar cell because the conductive polymer layer has the pH value close to a neutral value.

(2) Solar Cell

By the electrode body for a solar cell of the present invention, a dye-sensitized solar cell or an organic thin-film solar cell can be obtained.

The organic thin-film solar cell of the present invention comprises a positive electrode with a conductive part at least on the surface, a hole extraction layer located on the conductive part of the positive electrode, a photoelectric conversion layer located on the hole extraction layer having a hole transporter and an electron transporter, and a negative electrode located on the photoelectric conversion layer. The electrode body for a solar cell obtained by the present invention can be suitably used as a component in which a positive electrode and a hole extraction layer are laminated monolithically, and the conductive polymer layer formed on the conductive part of the substrate has excellent hole transportation capability and heat resistance compared with a conventional PEDOT:PSS layer.

The photoelectric conversion layer in the organic thin-film solar cell contains a hole transporter (p-type semiconductor) and an electron transporter (n-type semiconductor). As the hole transporter, a compound used as a hole transporter in a conventional organic thin-film solar cell is used without any restriction, and polyphenylene and its derivatives, polyphenylene vinylene and its derivatives, polysilane and its derivatives, polyalkylthiophene and its derivatives, porphyrin derivatives, phthalocyanine and phthalocyanine derivatives can be exemplified. For the electron transporter, a compound used as an electron transporter in a conventional organic thin-film solar cell can be used without any restriction, and fullerene and fullerene derivatives, carbon nanotube, polyfluorene derivatives, perylene derivatives, polyquinone derivatives, a polymer having a cyano group or a trifluoromethyl group can be exemplified. For the hole transporter and the electron transporter, a single compound can be used, or a mixture of two types or more can also be used.

The photoelectric conversion layer may be a bilayer type in which a hole transporter and an electron transporter are stacked in layers, or a bulk hetero type in which a hole transporter and an electron transporter are mixed, or a p-i-n type in which a mixed layer of a hole transporter and an electron transporter is formed between a hole transporter and an electron transporter. In case of the bilayer type or the p-i-n type, the hole transporter is located immediately on the conductive polymer layer in the electrode body for a solar cell of the present invention.

The thickness of the photoelectric conversion layer is generally within the range of 1 to 3000 nm, preferably within the range of 1 to 600 nm. If the thickness of the photoelectric conversion layer is more than 3000 nm, it is not preferable because the internal resistance of the photoelectric conversion layer becomes high. If the thickness of the photoelectric conversion layer is less than 1 nm, a negative electrode and a conductive polymer layer may make contacts.

For the negative electrode in the organic thin-film solar cell, a substrate at least on the surface having a conductive part with a work function lower than that of the conductive part of the substrate contained in the electrode body for a solar cell of the present invention (the positive electrode of the organic thin-film solar cell) is used. For example, a substrate at least on the surface having a layer of metal or alloy such as lithium, aluminum, aluminum-lithium alloy, calcium, magnesium and magnesium-silver alloy can be used as the negative electrode. The conductive part can be a single layer or a multilayer with different work functions.

Also, if a substrate contained in the electrode body for a solar cell of the present invention is opaque, a transparent substrate is used as the negative electrode. For such a negative electrode, a transparent substrate in which a transparent conductive layer such as ITO, tin oxide and FTO layer is formed by vapor deposition or coating on the surface of an insulating transparent substrate of glass such as optical glass, quartz glass and alkali-free glass, or plastic such as polyethylene naphthalate, polycarbonate and polyacrylate, can be suitably used.

The organic thin-film solar cell can be obtained with a heretofore known method by using the electrode body for a solar cell of the present invention. For example, the cell can be obtained by forming a photoelectric conversion layer on the conductive polymer layer of the electrode body for a solar cell of the present invention, according to the kind of a hole transporter and an electron transporter to be used, by a dry process such as a vacuum deposition method and a sputtering method, or by a wet process such as spin coat, bar coat and cast coating by using a solution in which a hole transporter and/or an electron transporter are added to a solvent such as toluene, chlorobenzene or ortho-dichlorobenzene, heating and drying the photoelectric conversion layer obtained if necessary, then forming a negative electrode by a vacuum deposition method or a sputtering method. The cell can also be obtained by filling a solution containing a hole transporter and an electron transporter between the conductive polymer layer in the electrode body for a solar cell of the present invention and a conductive part of a negative electrode, and then heating and drying the solution.

The dye-sensitized solar cell of the present invention comprises a negative electrode having a semiconductor layer with a pigment as a photosensitizer, an electrolyte layer located on the semiconductor layer of the negative electrode having paired oxidized species and reduced species, and a positive electrode located on the electrolyte layer having a conductive polymer layer that acts as a catalyst to convert the oxidized species into the reduced species. The electrode body for a solar cell of the present invention can be used suitably as a positive electrode, and the conductive polymer layer formed on the conductive part of a substrate has enough catalytic capability to convert the oxidized species into the reducing species in the redox pair.

For the conductive substrate and the semiconductor layer composing the negative electrode in the dye-sensitized solar cell, a conductive substrate and a semiconductor layer in a conventional dye-sensitized solar cell can be used without any restriction.

As the conductive substrate, a substrate with a conductive part at least on the surface can be used, and the conductive part of the substrate may be a single layer or may contain different kinds of multilayer. For example, a plate or a foil of conductive material such as platinum, nickel, titanium and steel can be used as the substrate, or, a transparent substrate in which a transparent conductive layer such as ITO, tin oxide and FTO layer is formed by vapor deposition or coating on the surface of an insulating transparent substrate of glass such as optical glass, quartz glass and alkali-free glass, or plastic such as polyethylene terephthalate, polyethylene naphthalate, and polycarbonate, can be also used. In case a substrate contained in the electrode body for a solar cell of the present invention is opaque, a transparent substrate is used as a substrate in the negative electrode. Moreover, if the substrate contained in the electrode body for a solar cell obtained by the present invention is transparent, a fully-transparent solar cell can be composed by using a transparent substrate also for the negative electrode.

The semiconductor layer can be formed by using an oxide semiconductor such as titanium oxide, zirconium oxide, zinc oxide, tin oxide, nickel oxide, calcium titanate, and strontium titanate. As the oxide semiconductor, a single compound can be used, or two or more types can be mixed and used. It is preferable that titanium oxide, which has high photoelectric conversion efficiency, is used. The oxide semiconductor is generally used in a porous embodiment so that many pigments can be supported in the semiconductor layer.

As the pigment that acts as a photosensitizer, an organic dye or a metal complex dye can be used. As an organic dye, pigments such as coumalins, cyanines, merocyanines, phthalocyanines and porphyrins can be used, and it is preferable to use a coumalin pigment. As a metal complex dye, osmium complexes, ruthenium complexes or iron complexes can be used, and especially, it is preferable to use a ruthenium bipyridine complex such as N3 and N719 or a ruthenium terpyridine complex such as N749 in that they have a wide absorption band. For these pigments, a single compound can be used, or a mixture of two or more types can also be used.

The negative electrode of the dye-sensitized solar cell can be obtained by a heretofore known method. For example, the porous layer of an oxide semiconductor is formed on a substrate by applying a dispersion containing oxide semiconductor particles and an organic binder such as polytetrafluoroethylene, polyvinylidene fluoride and carboxymethylcellulose by a wet process such as spin coat, bar coat or cast coating, heating and drying the dispersion, and then firing. Then, the substrate after firing is immersed in a solution in which the above-mentioned pigment is dissolved into a solvent such as ethanol, isopropyl alcohol and butylalcohol, is taken out from the immersion fluid after the predetermined time is elapsed, is dried and the pigment is supported in the oxide semiconductor, so that a negative electrode can be obtained. The thickness of the semiconductor layer is generally within the range of 1 to 100 µm, preferably 3 to 50 µm. If the thickness of the semiconductor layer is less than 1 µm, the light absorption can be insufficient, and the thickness of the semiconductor layer is more than 100 µm, it is not preferable because the travel distance of the electron from the oxide semiconductor to the conductive part of the substrate becomes long and the electron becomes deactivated.

As the electrolyte to compose the electrolyte layer of the dye-sensitized solar cell, an electrolyte in which a combination of an iodide and iodine constituting an iodine redox pair, a combination of a bromide and bromine constituting a bromine redox pair, or a Co(II) polypyridine complex constituting a cobalt complex redox pair is dissolved into an organic solvent such as acetonitrile, 3-methoxypropionitrile and ethylene glycol can be used. It is preferable to use the combination of iodide and iodine, which has high photoelectric conversion efficiency. Moreover, the electrolyte layer can be formed by gel electrolyte in which the electrolyte becomes pseudo-solid with addition of gelatinizer. If it is made a physical gel, polyacrylonitrile, and polyvinylidene fluoride can be used as gelatinizer, and if it is made a chemical gel, a combination of acryl(methacryl)ester oligomer or tetra(bromomethyl)benzene and polyvinylpyridine can be used as gelatinizer.

The dye-sensitized solar cell can be obtained by a heretofore known method by using the electrode body for a solar cell of the present invention. For example, the cell can be obtained by placing the semiconductor layer of a negative electrode and the conductive polymer layer of the electrode body for a solar cell of the present invention at a given interval, injecting electrolyte in the interval, and heating if necessary to form an electrolyte layer. The thickness of the electrolyte layer is generally within the range of 1 to 10 µm. If the thickness of the electrolyte layer is less than 1 µm, the semiconductor layer of the negative electrode may short-circuit, and if the thickness of the electrolyte layer is more than 10 µm, it is not preferable because the internal resistance becomes high.

EXAMPLES

The examples of the present invention are shown as follows, but the present invention is not limited to the following examples.

(1) Manufacture of an Electrode Body for a Solar Cell

Example 1

A solution in which EDOT and water were phase-separated was obtained by introducing 50 mL of distilled water into a glass container and adding to this 0.140 g (concentration: 0.02 M) of EDOT. An opaque dispersion in which EDOT is dispersed as oil drops in water was obtained by irradiating an ultrasonic wave with the frequency of 20 kHz and at the output of 22.6 W/cm$^2$ for 5 minutes into the solution. A transparent dispersion was obtained by irradiating an ultrasonic wave with the frequency of 1.6 MHz and at the output of 22 W/cm$^2$ for 5 minutes, and then an ultrasonic wave with the frequency of 2.4 MHz and at the output of 7.1 W/cm$^2$ for 5 minutes into the opaque dispersion. When the size of the EDOT oil drops of the transparent dispersion was measured by a dynamic light scattering method at 25 degrees centigrade, the average diameter of the oil drops was found to be 52.2 nm and 99.9% of the total number of oil drops had a diameter of 250 nm or less, and 95.2% of the total number had a diameter of 100 nm or less. This dispersion remained transparent after it was left at room temperature for two days. A polymerization solution was obtained by dissolving sodium bis(pentafluoroethanesulfonyl)imide at the concentration of 0.08 M into the transparent dispersion.

An ITO electrode as a working electrode with an area of 1 cm$^2$, a platinum mesh as a counter electrode with an area of 4 cm$^2$, and a silver-silver chloride electrode as a reference electrode were introduced to the obtained polymerization solution, and galvanostatic electrolytic polymerization was performed for 60 seconds under a current condition of 10 µA/cm$^2$. The working electrode after electrolytic polymerization was washed with methanol, and then dried at 150 degrees centigrade for 30 minutes, and an electrode body in which a conductive polymer layer was formed on the ITO electrode was obtained.

Example 2

The procedure of Example 1 was repeated by using ammonium borodisalicylate instead of sodium bis(pentafluoroethanesulfonyl)imide.

Comparative Example 1

100 µL of commercially available aqueous PEDOT:PSS dispersion (trade name: Baytron P, manufactured by H. C. Starck) was cast on an ITO electrode with an area of 1 cm$^2$ and spin coating was carried out for 30 seconds at the rotation frequency of 5000 rpm. Then, it was dried at 150 degrees centigrade for 30 minutes and an electrode body in which a conductive polymer layer was formed on the ITO electrode was obtained.

Comparative Example 2

A polymerization solution was obtained by introducing 50 mL of distilled water into a glass container, adding to this 0.14 g (concentration: 0.02 M) of EDOT and 1.08 g (concentration: 0.08 M) of sodium butylnaphthalene sulfonate as a surfactant having a sulfonic acid salt group, and stirring it at 25 degrees centigrade for 60 minutes. An ITO electrode as a working electrode with an area of 1 cm$^2$, a platinum mesh as a counter electrode with an area of 4 cm$^2$, and a silver-silver chloride electrode as a reference electrode were introduced to the polymerization solution obtained, and galvanostatic electrolytic polymerization was performed for 60 seconds under a current condition of 10 μA/cm$^2$. The working electrode after electrolytic polymerization was washed with methanol, and then dried at 150 degrees centigrade for 30 minutes, and an electrode body in which a conductive polymer layer was formed on the ITO electrode was obtained.

Comparative Example 3

The procedure of Example 1 was repeated by using sodium p-toluenesulfonate instead of sodium bis(pentafluoroethanesulfonyl)imide.

Comparative Example 4

The procedure of Example 1 was repeated by using citric acid instead of sodium bis(pentafluoroethanesulfonyl)imide.

Comparative Example 5

The procedure of Example 1 was repeated by using potassium nitrate instead of sodium bis(pentafluoroethanesulfonyl)imide.

Comparative Example 6

The procedure of Example 1 was repeated by using lithium perchlorate instead of sodium bis(pentafluoroethanesulfonyl)imide.

The optical transmittance of the electrode body of Example 2, the electrode body of Comparative Example 1, and an ITO electrode used as a substrate in the manufacturing process of these electrode bodies was measured with a visible-ultraviolet spectrophotometer. FIG. 1 shows the results. Since the PEDOT layer in the electrode body in Example 2 was mainly composed of PEDOT particles having a size of 100 nm or less, the optical wavelength easily went through the PEDOT layer without scattering and the PEDOT layer showed almost the same optical transmittance as the electrode body in Comparative Example 1 in the visible light region (360 to 830 nm).

Figure 2:
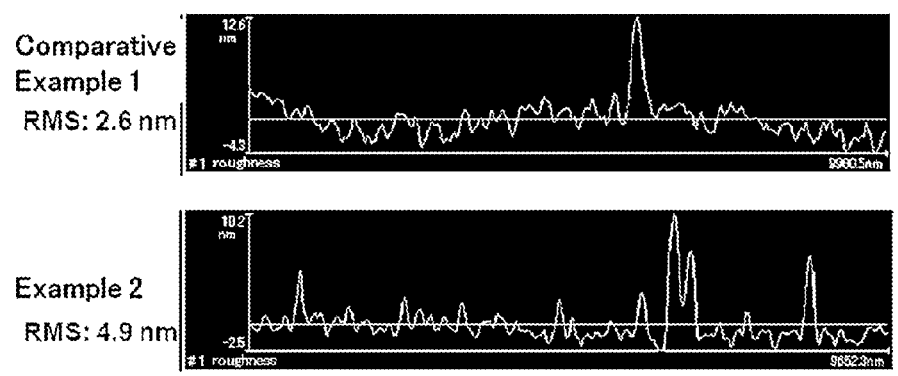
In FIG. 2, the smoothness of the surface of an electrode body obtained from a polymerization solution containing ammonium borodisalicylate and EDOT oil drops is compared with the smoothness of the surface of an electrode body obtained from a slurry containing PEDOT:PSS.
Figure 3:
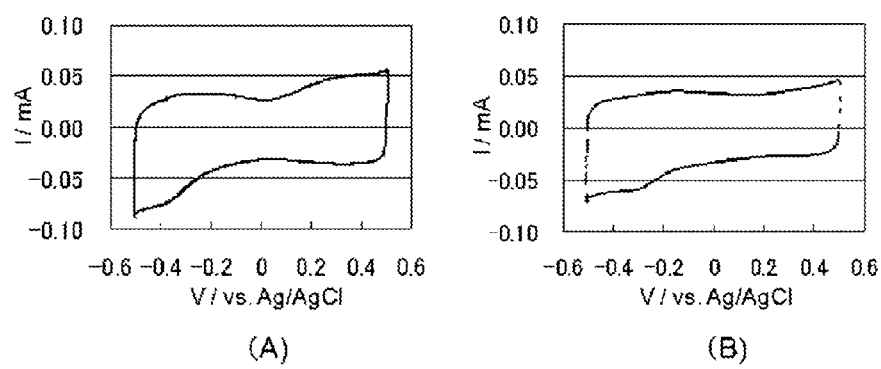
FIG. 3 shows a cyclic voltammogram in an aqueous sodium sulfate solution of an electrode body obtained from a polymerization solution containing sodium bis(pentafluoroethanesulfonyl)imide and EDOT oil drops; (A) shows the measurement result of the early stage and (B) shows the measurement result after a high temperature is experienced.
Figure 4:
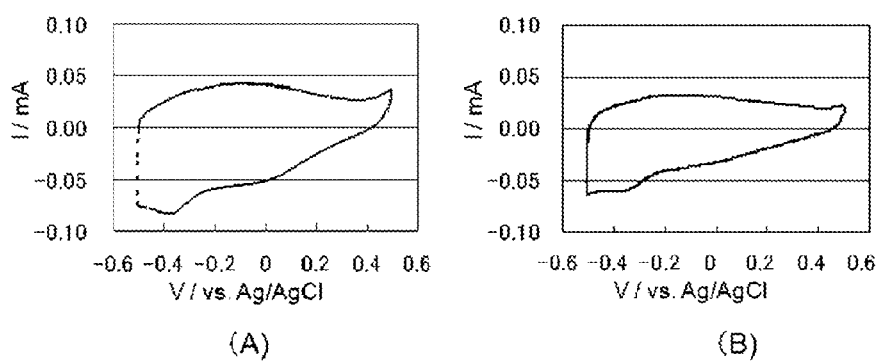
FIG. 4 shows a cyclic voltammogram in an aqueous sodium sulfate solution of an electrode body obtained from a polymerization solution containing ammonium borodisalicylate and EDOT oil drops; (A) shows the measurement result of the early stage and (B) shows the measurement result after a high temperature is experienced.
Figure 5:
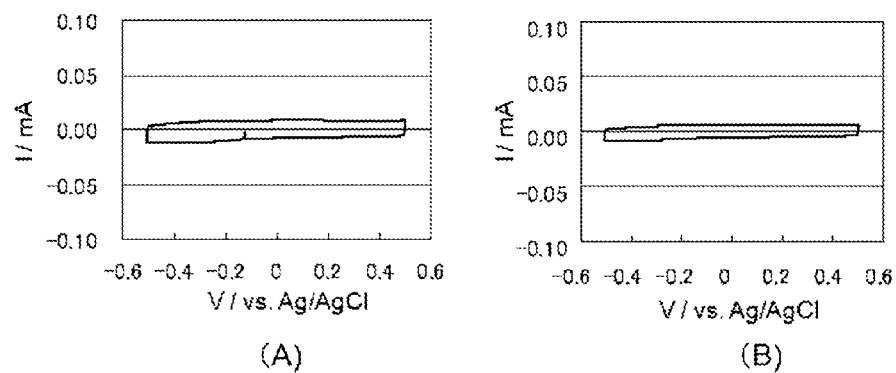
FIG. 5 shows a cyclic voltammogram in an aqueous sodium sulfate solution of an electrode body obtained from a slurry containing PEDOT:PSS; (A) shows the measurement result of the early stage and (B) shows the measurement result after a high temperature is experienced.
Figure 6:
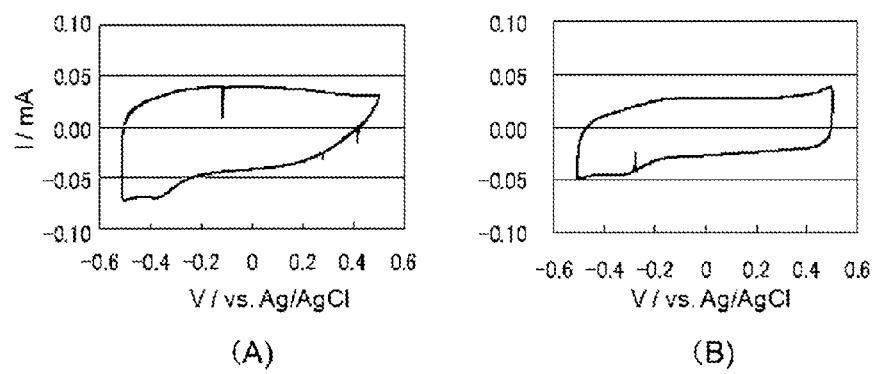
FIG. 6 shows a cyclic voltammogram in an aqueous sodium sulfate solution of an electrode body obtained from a polymerization solution containing sodium butylnaphthalene sulfonate and EDOT; (A) shows the measurement result of the early stage and (B) shows the measurement result after a high temperature is experienced.
Figure 7:
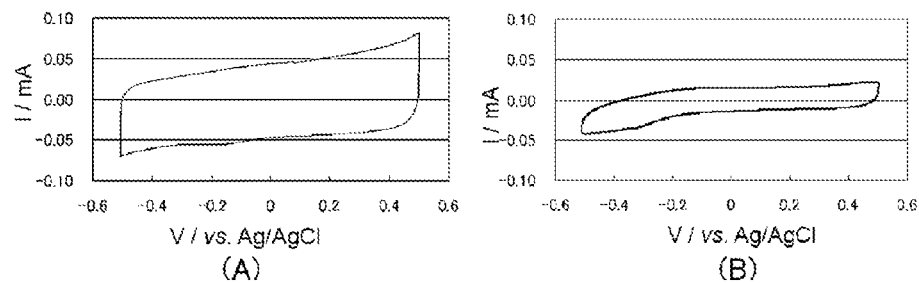
FIG. 7 shows a cyclic voltammogram in an aqueous sodium sulfate solution of an electrode body obtained from a polymerization solution containing potassium nitrate and EDOT oil drops; (A) shows the measurement result of the early stage and (B) shows the measurement result after a high temperature is experienced.
Figure 8:
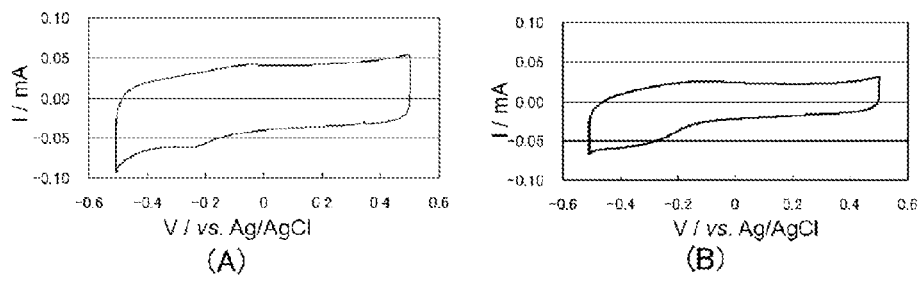
FIG. 8 shows a cyclic voltammogram in an aqueous sodium sulfate solution of an electrode body obtained from a polymerization solution containing lithium perchlorate and EDOT oil drops; (A) shows the measurement result of the early stage and (B) shows the measurement result after a high temperature is experienced.

For the electrode bodies of Example 2 and Comparative Example 1, the film thickness of the conductive polymer layer and the root mean square roughness (RMS) of the surface of the layer were measured. The difference on the surface between the forming part of a conductive polymer layer and the non-forming part of a conductive polymer layer (the surface of the ITO electrode) was calculated as the thickness of the conductive polymer layer. As a result, it was found that the thickness of the polymer layer of the electrode body of Example 2 was 33 nm and that the thickness of the polymer layer of the electrode body of Comparative Example 1 was 41 nm. The RMS of the surface of the conductive polymer layer was calculated by observing a surface area 100×100 μm$^2$ in size in the central part of the polymer layer. FIG. 2 shows the observation results and the RMS values calculated. The polymer layer of the electrode body of Example 2 (RMS: 4.9 nm) had a slightly rougher surface than the polymer layer of the electrode body in Comparative Example 1 (RMS: 2.6 nm), but each polymer layer had a smooth surface.

(2) Evaluation of Electrochemical Response in a Sodium Sulfate Electrolyte

The hole transportation capability of the electrode bodies in Examples 1 and 2 and Comparative Examples 1 to 6 was evaluated by cyclic voltammograms. Any one of the electrode bodies in Examples 1 and 2 and Comparative Examples 1 to 6 as a working electrode, a platinum mesh as a counter electrode with an area of 4 cm$^2$ and a silver-silver chloride electrode as a reference electrode were introduced in an electrolyte including sodium sulfate (concentration: 1 M) in water, and a cyclic voltammogram was evaluated with a scanning potential range of −0.5V to +0.5 V, with a scanning rate of 10 mV/s. For the electrode bodies in Comparative Examples 3 and 4, a stable cyclic voltammogram could not be obtained.

Then, the electrode bodies of Examples 1 and 2, and Comparative Examples 1, 2, 5 and 6 were taken out of the electrolytic solution, and after washing, thermal aging was applied for 330 hours at 150 degrees centigrade in the atmosphere, and cyclic voltammograms were obtained again.

FIGS. 3 to 8 show the cyclic voltammograms before and after thermal aging. FIG. 3, FIG. 4, FIG. 5, FIG. 6, FIG. 7 and FIG. 8, in this order, show cyclic voltammograms of an electrode body of Example 1 (dopant: bis(pentafluoroethanesulfonyl)imide anion), Example 2 (dopant: borodisalicylate anion), Comparative Example 1 (dopant: PSS anion), Comparative Example 2 (dopant: butylnaphthalene sulfonate anion), Comparative Example 5 (dopant: nitrate anion) and Comparative Example 6 (dopant: perchlorate anion). (A) is an early-stage cyclic voltammogram and (B) is a cyclic voltammogram after thermal aging. It can be concluded that the larger the electrochemical response in a cyclic voltammogram, the more excellent hole transportation capability the electrode body has, while the less the cyclic voltammograms change before and after thermal aging, the more excellent heat resistance the electrode body has.

By comparing the early stage cyclic voltammograms, it can be seen that the electrode body with a PEDOT:PSS layer in Comparative Example 1 shows a remarkably small current response compared with other electrode bodies and has little electrochemical activity. By comparing the cyclic voltammograms before and after thermal aging, it can be seen that the electrode bodies in Examples 1 and 2 show a remarkably small decrease in current response due to heat experience compared with the electrode bodies in Comparative Examples 1, 2, 5 and 6. Therefore, it was found that the electrode body in the present invention has excellent hole transportation capability and excellent heat resistance.

In order to increase the aqueous concentration of EDOT with low water solubility, anionic surfactants with a sulfonate group or sulfonic acid salt group have been frequently used as a supporting electrolyte, and it is reported that a PEDOT layer in which an anion of these surfactants is doped has excellent thermal durability because de-doping is inhibited by the bulkiness of the dopant. For example, JP 2000-269087 A reports electrolytic polymerization with a polymerization solution of an aqueous medium in which a thiophene derivative such as EDOT is emulsified by an alkylnaphthalene sulphonate surfactant, where a stable conductive polymer layer is obtained at high temperature and high humidity because de-doping is inhibited due to the bulkiness of the alkylnaphthalene sulfonate anion taken into the polymer layer as a dopant.

Comparing the cyclic voltammograms of the electrode bodies in Comparative Examples 1 and 2 with the electrode bodies in Comparative Examples 5 and 6, it can be seen that the former showed a small decrease in current response due to heat experience, but the electrode bodies in Examples 1 and 2 showed even more excellent heat resistance. Especially, the electrode body in Example 1 obtained from a polymerization solution including sodium bis(pentafluoroethanesulfonyl)imide as a supporting electrolyte showed an extremely excellent thermal stability.

Therefore, it was found that the electrode body for a solar cell of the present invention has more excellent hole transportation capability than the conventional electrode body with a PEDOT:PSS layer and, moreover, has a more excellent heat resistance than the electrode body with a PEDOT layer containing an anion of the surfactant with a bulky sulfonic acid group or sulfonic acid salt group as a dopant. From this result, it was concluded that the electrode body for a solar cell in the present invention is suitable as a component in an organic thin film solar cell, that is, as a component in which a positive electrode and a hole extraction layer are united.

(3) Evaluation of Electrochemical Response in $I^-/I_3^-$ Electrolyte

Electrochemical response in $I^-/I_3^-$ electrolyte of the electrode bodies of Example 1 and Comparative Example 1 was evaluated by cyclic voltammograms.

An electrode body of Examples 1 or Comparative Example 1 as a working electrode, a platinum mesh as a counter electrode with an area of 4 $cm^2$, and a silver-silver chloride electrode as a reference electrode were introduced in an electrolyte in which 10 mM lithium iodide, 1 mM iodine, and 1M lithium tetrafluoroborate were dissolved in acetonitrile, and a cyclic voltammogram was evaluated with a scanning potential range of −0.8 to +0.8 V, with a scanning rate of 10 mV/s.

Figure 9:
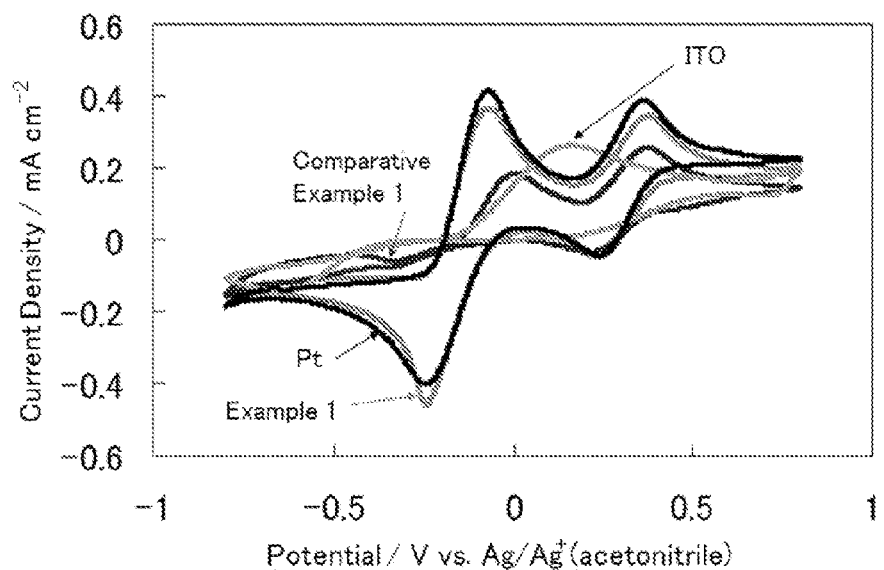
In FIG. 9, a cyclic voltammogram in an electrolyte, which contains an $I^-/I_3^-$ redox pair, of an electrode body obtained from a polymerization solution containing sodium bis(pentafluoroethanesulfonyl)imide and EDOT oil drops is compared with a cyclic voltammogram of an electrode body obtained from a slurry containing PEDOT:PSS and a cyclic voltammogram of a Pt-evaporated electrode body.

FIG. 9 shows cyclic voltammograms obtained in comparison with cyclic voltammograms of an ITO electrode used as a substrate in manufacturing these electrode bodies and of a Pt electrode in which a Pt layer with the area of 1 $cm^2$ is formed by a sputtering method on a glass plate.

A clear oxidation-reduction was not found in the cyclic voltammogram of the ITO electrode. Two pairs of oxidation-reduction waves were clearly found in the cyclic voltammograms of the electrode body of Example 1 and of the Pt electrode. The oxidation-reduction wave on the negative electric potential is an oxidation-reduction wave corresponding to $I^-/I_3^-$, and the oxidation-reduction wave on the positive electric potential is an oxidation-reduction wave corresponding to $I_2/I_3^-$. In a dye-sensitized solar cell, the reduction wave from $I_3^-$ to $I^-$ that was found around −0.2 V against the silver-silver chloride electrode is especially important, because sufficient reproduction of $I^-$ is required. However, in the cyclic voltammogram of the electrode body of Comparative Example 1, as in the report of Non-Patent Document 2, the reduction wave from $I_3^-$ to $I^-$ was not found. Therefore, it was found that the electrode body of Example 1, compared with the electrode body of Comparative Example 1 with a PEDOT:PSS layer, which has been considered as a positive electrode of a dye-sensitized solar cell, has an excellent reduction catalytic activity to convert $I_3^-$ to $I^-$, and can be a substitute for a Pt electrode as a positive electrode of a dye-sensitized solar cell.

Then, for the electrode bodies in Examples 1 and 2 and Comparative Example 2, which showed comparatively excellent heat resistance in the evaluation in sodium sulfate electrolyte, the electrochemical response in the $I^-/I_3^-$ electrolyte was evaluated with cyclic voltammograms. Then, these electrodes were taken out of the electrolyte, and after washing, thermal aging was carried out for 700 hours at 130 degrees centigrade in the atmosphere, cyclic voltammograms were obtained again, and heat resistance was evaluated. The conditions to obtain the cyclic voltammograms are the same as the conditions under which the results of FIG. 9 were obtained.

Figure 10:
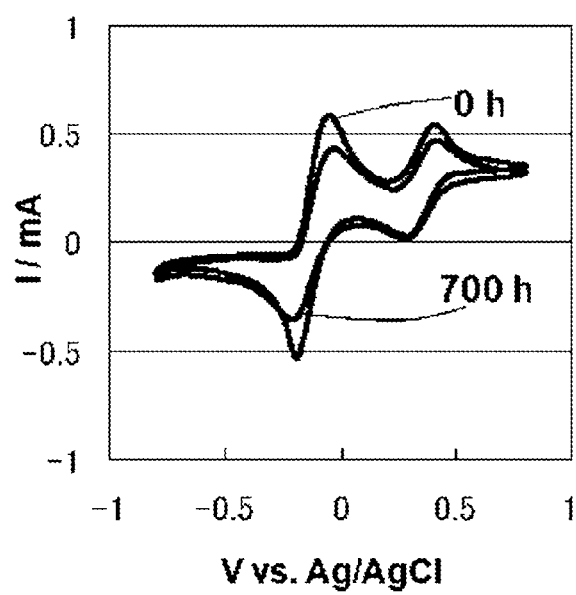
FIG. 10 shows a cyclic voltammogram in an electrolyte, which contains an $I^-/I_3^-$ redox pair, of an electrode body obtained from a polymerization solution containing sodium bis(pentafluoroethanesulfonyl)imide and EDOT oil drops.
Figure 11:
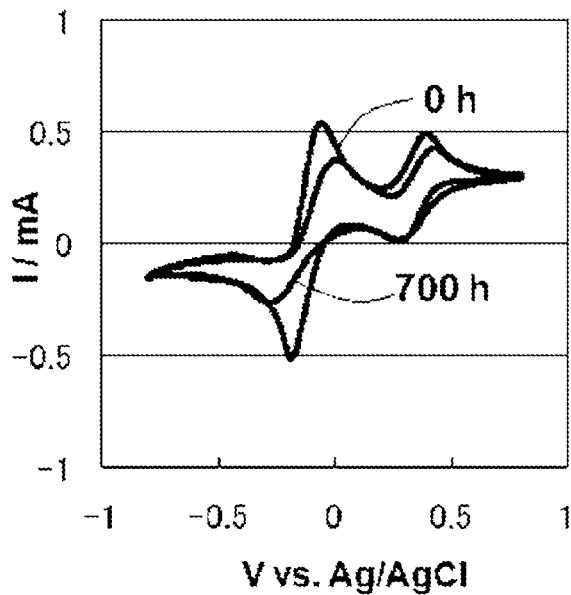
FIG. 11 shows a cyclic voltammogram in an electrolyte, which contains an $I^-/I_3^-$ redox pair, of an electrode body obtained from a polymerization solution containing ammonium borodisalicylate and EDOT oil drops.
Figure 12:
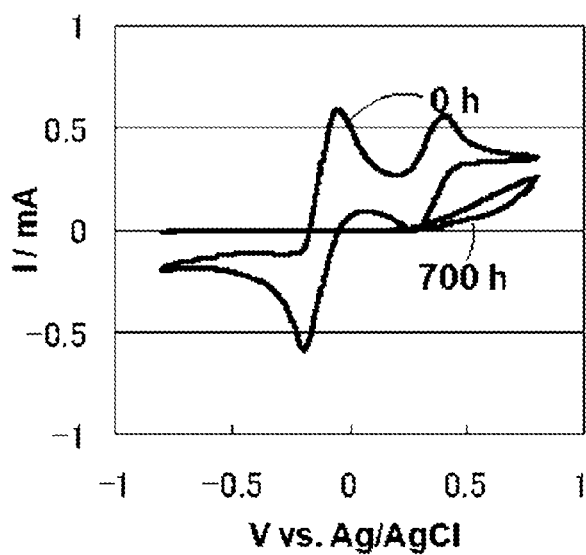
FIG. 12 shows a cyclic voltammogram in an electrolyte, which contains an $I^-/I_3^-$ redox pair, of an electrode body obtained from a polymerization solution containing sodium butylnaphthalene sulfonate and EDOT.

FIGS. 10 to 12 show cyclic voltammograms before and after thermal aging. FIG. 10, FIG. 11, and FIG. 12 show cyclic voltammograms of the electrode body of Example 1 (dopant: bis(pentafluoroethanesulfonyl)imide anion), Example 2 (dopant: borodisalicylate anion) and Comparative Example 2 (dopant: butylnaphthalene sulfonate anion) in this order.

Although in the early-stage, two pairs of oxidation-reduction waves were found in all the cyclic voltammograms of the electrode bodies of Examples 1 and 2 and Comparative Example 2, after thermal aging, none of the two pairs of oxidation-reduction waves were found in the cyclic voltammogram of the electrode body of Comparative Example 2, while in both of the cyclic voltammograms of the electrode bodies of Examples 1 and 2, two pairs of oxidation-reduction waves were clearly found.

Therefore, it was concluded that the conductive polymer layer in the electrode body for a solar cell of the present invention has excellent reduction catalytic activity to convert an oxidizing species ($I_3^-$) into a reducing species ($I^-$) and, moreover, has more excellent heat resistance than the conductive polymer layer in which an anion of the surfactant with a bulky sulfonic acid group or sulfonate salt group are contained as a dopant. From this result, it was found that the electrode body for a solar cell of the present invention is suitable as a positive electrode in a dye-sensitized solar cell.

(4) Evaluation as a Dye-Sensitized Solar Cell

Example 3

A solution in which EDOT and water were phase-separated was obtained by introducing 50 mL of distilled water into a glass container and adding to this 0.140 g (concentration: 0.02 M) of EDOT. An opaque dispersion in which EDOT is dispersed as oil drops in water was obtained by adding p-nitrophenol at the concentration of 0.02 M and ammonium borodisalicylate at the concentration of 0.08 M to the solution, and irradiating an ultrasonic wave with the frequency of 20 kHz and at the output of 22.6 $W/cm^2$ for 5 minutes into the obtained solution. A transparent dispersion was obtained by irradiating an ultrasonic wave with the frequency of 1.6 MHz and at the output of 22 $W/cm^2$ for 5 minutes, and then an ultrasonic wave with the frequency of 2.4 MHz and at the output of 7.1 $W/cm^2$ for 5 minutes into the opaque dispersion.

A FTO electrode as a working electrode with an area of 1 $cm^2$, a platinum mesh as counter electrode with an area of 4 $cm^2$, and a silver-silver chloride electrode as a reference electrode were introduced to the obtained polymerization solution, and galvanostatic electrolytic polymerization was performed for 60 seconds under a current condition of 10 $\mu A/cm^2$. The working electrode after electrolytic polymerization was washed with methanol, and then dried at 150 degrees centigrade for 30 minutes, and an electrode body on which a conductive polymer layer was formed on the FTO electrode (positive electrode) was obtained.

Titanium oxide paste (manufacturer: JGC Catalysts and Chemicals Ltd.) was applied to the surface of an ITO electrode by bar coat method so that the thickness of the layer would be about 100 μm, was dried preliminarily for 10 minutes at 130 degrees centigrade, and then burned for 30 minutes at 450 degrees centigrade so that a titanium oxide porous layer was formed on the ITO electrode. Further, by immersing the titanium oxide porous layer for 3 hours in an ethanol solution containing pigment N719 at the concentration of 0.2 mM and drying it at a room temperature, the titanium oxide porous layer was impregnated with the pigment N719, and a negative electrode of a dye-sensitized solar cell was obtained.

Then, by bonding together the negative electrode and positive electrode so that the titanium oxide porous layer and the conductive polymer layer faced each other, and impregnating an electrolyte into the gap, an electrolyte layer was formed. For the electrolyte, a solution in which 0.5 M lithium iodide, 0.05 M iodine, and 0.5 M 4-t-butylpyridine were dissolved in acetonitrile was used. Lastly, a seal was made with epoxy resin, and a dye-sensitized solar cell was obtained.

Comparative Example 7

By bonding together the negative electrode obtained in Example 3 and a positive electrode composed of a Pt electrode in which a Pt layer with the area of 1 cm² was placed by a sputtering method on a steel substrate so that the titanium oxide porous layer and the Pt layer faced each other, and by impregnating an electrolyte into the gap, an electrolyte layer was formed. For the electrolyte, a solution in which 0.5 M lithium iodide, 0.05 M iodine, and 0.5 M 4-t-butylpyridine were dissolved in acetonitrile was used. Lastly, a seal was made with epoxy resin, and a dye-sensitized solar cell was obtained.

Figure 13:
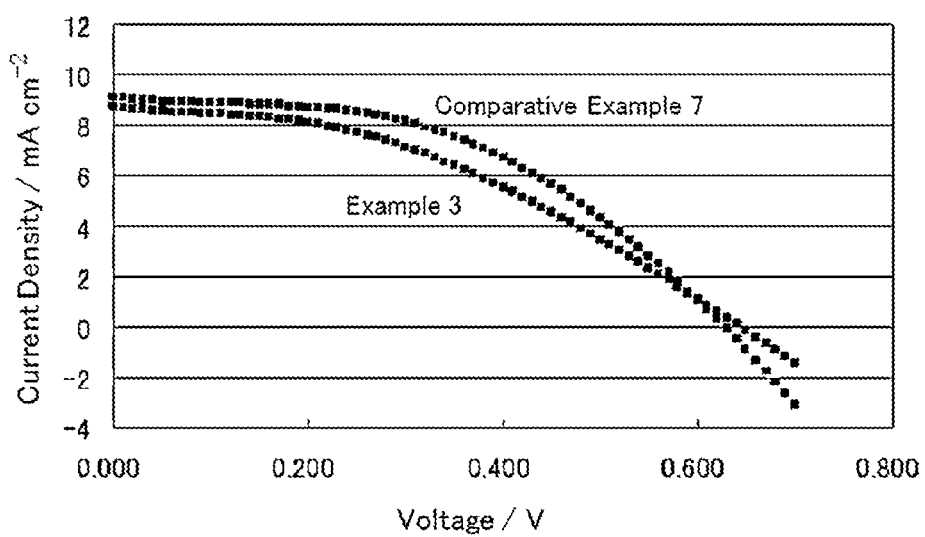
FIG. 13 shows the evaluation result for a dye-sensitized solar cell.

For the dye-sensitized solar cells in Example 3 and Comparative Example 7, current-voltage characteristics under the irradiation condition of 100 mW/cm² and AM 1.5 G by a solar simulator were evaluated. Evaluation was made at 20 degrees centigrade with the voltage changing at the speed of 50 mV/s. FIG. 13 shows the observation results obtained. Table 1 summarizes the short circuit current, open voltage, fill factor and photoelectric conversion efficiency obtained from the observation results of FIG. 13. Though inferior to the photoelectric conversion efficiency of the solar cell in Comparative Example 7 in which a conventional Pt electrode is used as a positive electrode, the photoelectric conversion efficiency more than 80% of that of the solar cell of Comparative Example 7 was also obtained in the solar cell of Example 3.

TABLE I

| | Short Circuit Current mA | Open Voltage V | Fill Factor % | Conversion Efficiency % |
|---|---|---|---|---|
| Example 3 | 8.75 | 0.65 | 0.40 | 2.25 |
| Comparative Example 7 | 9.16 | 0.63 | 0.47 | 2.70 |

INDUSTRIAL APPLICABILITY

The electrode body for a solar cell of the present invention can be suitably used as a component of both an organic thin-film solar cell and a dye-sensitized solar cell.

What is claimed is:

1. An electrode body for a solar cell comprising a substrate with a conductive part at least on the surface and a conductive polymer layer located on the conductive part of the substrate, wherein the conductive polymer layer comprises:
   a polymer derived from at least one monomer selected from the group consisting of 3,4-disubstituted thiophenes; and
   an anion as a dopant to the polymer generated from at least one organic non-sulfonate compound having an anion with the molecular weight of 200 or more.

2. The electrode body for a solar cell according to claim 1, wherein the organic non-sulfonate compound is at least one compound selected from the group consisting of borodisalicylic acid and borodisalicylic salts.

3. The electrode body for a solar cell according to claim 1, wherein the organic non-sulfonate compound is at least one compound selected from the group consisting of a sulfonylimidic acid of the formula (I) or the formula (II)

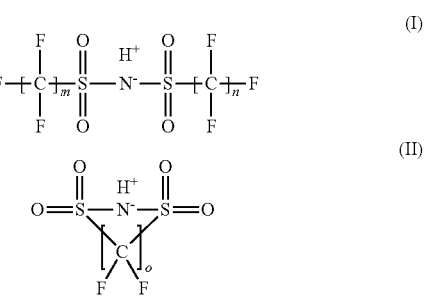

where m is an integer from 1 to 8, n is an integer from 1 to 8, and o is an integer 2 or 3, and salts thereof.

4. The electrode body for a solar cell according to claim 3, wherein the organic non-sulfonate compound is a salt of bis(pentafluoroethanesulfonyl)imidic acid.

5. The electrode body for a solar cell according to claim 1, wherein the monomer is 3,4-ethylenedioxythiophene.

6. The electrode body for a solar cell according to claim 1, wherein the substrate is transparent.

7. A method for producing the electrode body for a solar cell according to claim 1, comprising:
   (A) a preparation process of obtaining a polymerization solution which comprises water as a solvent; the monomer dispersed as oil drops in water; and the organic non-sulfonate compound, and which is transparent, by the following steps (a1) to (a4):
       (a1) a step of adding the monomer to water to prepare a phase separation solution where water and the monomer are phase-separated;
       (a2) a step of irradiating the phase separation solution with an ultrasonic wave to make the monomer dispersed in the form of oil drops and thus prepare an opaque dispersion;
       (a3) a step of irradiating the opaque dispersion with an ultrasonic wave having a frequency higher than that of the ultrasonic wave used in the step (a2) to reduce the mean size of the oil drops of the monomer and thus prepare a transparent dispersion;
       (a4) a step of adding the organic non-sulfonate compound as a supporting electrolyte to the phase separation solution, the opaque dispersion or the transparent dispersion; and
   (B) a polymerization process of introducing the substrate to the polymerization solution and performing electrolytic polymerization to form the conductive polymer layer by polymerization of the monomer on the conductive part of the substrate.

8. The method for producing the electrode body for a solar cell according to claim 7, wherein the ultrasonic wave in the step (a2) have a frequency within the range of 15 to 200 kHz and an output of 4 W/cm² or more.

9. The method for producing the electrode body for a solar cell according to claim 7, wherein the ultrasonic wave in the step (a3) have a frequency within the range of 1 to 4 MHz and an output of 5 W/cm² or more.

10. The method for producing the electrode body for a solar cell according to claim 7, wherein the ultrasonic irradiation time in the step (a2) is within the range of 2 to 10 minutes and the ultrasonic irradiation time in the step (a3) is within the range of 2 to 10 minutes.

11. The method for producing the electrode body for a solar cell according to claim 7, wherein the organic non-sulfonate compound is at least one compound selected from the group consisting of borodisalicylic acid and borodisalicylic salts.

12. The method for producing the electrode body for a solar cell according to claim 7, wherein the organic non-sulfonate compound is at least one compound selected from the group consisting of a sulfonylimidic acid of the formula (I) or the formula (II)

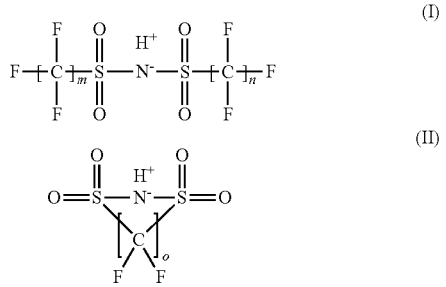

where m is an integer from 1 to 8, n is an integer from 1 to 8, and o is an integer 2 or 3, and salts thereof.

13. The method for producing the electrode body for a solar cell according to claim 7, wherein the organic non-sulfonate compound is a salt of bis(pentafluoroethanesulfonyl)imidic acid.

14. The method for producing the electrode body for a solar cell according to claim 7, wherein the monomer is 3,4-ethylenedioxythiophene.

15. The method for producing the electrode body for a solar cell according to claim 11, wherein the monomer is 3,4-ethylenedioxythiophene.

16. The method for producing the electrode body for a solar cell according to claim 7, wherein the substrate is transparent.

17. An organic thin-film solar cell comprising:
a positive electrode with a conductive part at least on the surface;
a hole extraction layer located on the conductive part of the positive electrode;
a photoelectric conversion layer located on the hole extraction layer having a hole transporter and an electron transporter; and
a negative electrode located on the photoelectric conversion layer, wherein the positive electrode and the hole extraction layer are composed of the electrode body for a solar cell according to claim 1.

18. A dye-sensitized solar cell comprising:
a negative electrode having a semiconductor layer with a pigment as a photosensitizer;
an electrolyte layer located on the semiconductor layer of the negative electrode having paired oxidized species and reduced species; and
a positive electrode located on the electrolyte layer having a conductive polymer layer that acts as a catalyst to convert the oxidized species into the reduced species, wherein the positive electrode is composed of the electrode body for a solar cell according to claim 1.

19. An organic thin-film solar cell comprising:
a positive electrode with a conductive part at least on the surface;
a hole extraction layer located on the conductive part of the positive electrode;
a photoelectric conversion layer located on the hole extraction layer having a hole transporter and an electron transporter; and
a negative electrode located on the photoelectric conversion layer, wherein the positive electrode and the hole extraction layer are composed of the electrode body for a solar cell according to claim 2.

20. A dye-sensitized solar cell comprising:
a negative electrode having a semiconductor layer with a pigment as a photosensitizer;
an electrolyte layer located on the semiconductor layer of the negative electrode having paired oxidized species and reduced species; and
a positive electrode located on the electrolyte layer having a conductive polymer layer that acts as a catalyst to convert the oxidized species into the reduced species, wherein the positive electrode is composed of the electrode body for a solar cell according to claim 2.

* * * * *